(12) United States Patent
Aue

(10) Patent No.: US 6,774,677 B2
(45) Date of Patent: Aug. 10, 2004

(54) DEVICE FOR LINKING A PROCESSOR TO A MEMORY ELEMENT AND MEMORY ELEMENT

(75) Inventor: Axel Aue, Korntal-Muenchingen (DE)

(73) Assignee: Robert Bosch GmbH, Stuttgart (DE)

(*) Notice: Subject to any disclaimer, the term of this patent is extended or adjusted under 35 U.S.C. 154(b) by 0 days.

(21) Appl. No.: 10/252,946

(22) Filed: Sep. 23, 2002

(65) Prior Publication Data

US 2003/0079111 A1 Apr. 24, 2003

(30) Foreign Application Priority Data

Sep. 21, 2001 (DE) .......................................... 101 46 722
Oct. 30, 2001 (DE) .......................................... 101 53 530

(51) Int. Cl.[7] .................. H03K 19/0175; H03K 19/094
(52) U.S. Cl. .......................................... 326/87; 326/27
(58) Field of Search ............................. 326/83, 86, 87, 326/26, 27, 30

(56) References Cited

U.S. PATENT DOCUMENTS 6,377,069 B1 * 4/2002 Veenstra et al. ............... 326/38

OTHER PUBLICATIONS

ANSI/TIA/EIA–644; "Electrical Char. of LVDS Interface Circuits", Feb. 2001, pp. 1–29.

IEEE standard P1596.3–1995; "Draft Standard for LVDS for SCI", Nov. 29, 1995, pp. 1–34.

IEEE Standard For Low–Voltage Differential Signals (LVDS) For Scalable Coherent Interface (SCI), IEEE Std 1596.3–1996, pp. 1–29.

* cited by examiner

Primary Examiner—Daniel Chang
(74) Attorney, Agent, or Firm—Kenyon & Kenyon

(57) ABSTRACT

A device having a processor and a memory element positioned outside the processor, as well as a device for linking a memory element to a processor, and a memory element, are described, the processor and the memory element being linked via address and/or data lines, the address and/or data lines each being implemented in a structure combining a differential structure, LVDS in particular, and a structure having transistors which switch to ground and voltage, SSTL in particular, which has corresponding transmitters and receivers.

7 Claims, 3 Drawing Sheets

DEVICE FOR LINKING A PROCESSOR TO A MEMORY ELEMENT AND MEMORY ELEMENT

FIELD OF THE INVENTION

The present invention relates to a device having a processor and a memory element positioned outside the processor and a device for linking the processor to the memory element, as well as a memory element.

BACKGROUND INFORMATION

Control units for controlling operating sequences, in particular in a motor vehicle, may exist. These may include, for example, control units for the motor controller, brake controllers, transmission controllers, etc. In addition to the processor and/or the computer, which contain internal memories, the digital parts contained in the control units may also include external memories, which are linked to the computer and/or the processor via a circuit board and/or circuit-board conductors. The external memories may be coupled to the processor via a circuit board and/or via circuit-board conductors. The link of this circuit board, however, may represent a limitation of the operating frequency of the coupling, since this link represents both a capacitive and an inductive load. The performance of this link, i.e., between computer and external memory, the transfer rate in particular, has a direct influence on the overall performance of the system in relation to the respective controller.

In order to achieve elevated performance, conventional link structures, such as SDRAM (synchronous dynamic random access memory), may allow the frequency to be increased, but with the limitation described above applying. A further problem for these links is that they were developed for relatively large distances between computer and memory and therefore may not achieve higher frequencies at certain limits.

Further increases in the clock frequency of the link between computer and external memory are promised by technologies such as DDRRAM (double data rate RAM), which is based on the SDRAM previously cited, as well as Rambus technologies such as RDRAM (Rambus DRAM) or DRDRAM (direct Rambus dynamic RAM).

A further problem arising in the event of increasing the link frequency is the emission and/or interference of electromagnetic signals and/or energy, due to which, for higher clock frequencies, more outlay may be required in the configuration for sufficient shielding to comply with the legal requirements and also to prevent undesired interference of signals, for example.

Therefore, a JEDEC standard (Joint Electronic Device Engineering Committee) was provided with the SSTL (stub series terminated logic) in order to increase the data transfer rate between a DRAM memory component and a CPU (central processing unit). In SSTL, the speed was increased through impedance adjustment of a transfer line, such as a bus, because reflecting waves, which were generated if a conventional low voltage method such as LVTTL (low voltage transistor transistor logic) was used, were reduced through the impedance adjustment. The SSTL interface thus offers a high data rate, but with higher EMC emission (electromagnetic compatibility) at the same time. Therefore, a non-differential bus interface was defined for DRAMs by the SSTL standard, which did implement a high data rate, but simultaneously implemented high EMC.

Thus, it has been shown that the related art may not provide optimal results in every regard.

In addition; in other technical fields, buses and/or bus systems, which are constructed in LVDS structure (low voltage differential signal), may exist as point-to-point links for coupling devices to a computer. This LVDS structure is standardized and known as a standard in accordance with ANSI/TIA/EIA-644. According to this standard, LVDS is used as a communication link between a computer and an associated monitor, for example.

Furthermore, the IEEE standard P1596.3-1995 defines the above-mentioned LVDS as a communication link between processors in multiprocessor systems, a point-to-point link also being constructed as bidirectional in half duplex operation in this case.

SUMMARY OF THE INVENTION

Therefore, an object of the present invention is to achieve a performance which is as high as possible, and to take the EMC problem, the emission in particular, into consideration, in order to avoid additional costs for reducing the emission and/or interference or the EMC problem in the device.

In the further description, LVDS and SSTL are cited as examples. This is not to be understood as restricting the object of the present invention. In general, any differential structure, LVDS in particular, and any structure having transistors which switch to voltage and ground, SSTL in particular, may be used according to the present invention. Therefore, the present invention is also illustrated for all differential and single-ended buses.

Therefore, according to the present invention, both interface functions may be implemented in one bus interface in a combined circuit logic and/or a combined structure. It may then be decided in the respective application whether the EMC rate in relation to emission and/or interference of electromagnetic signals (EMC problem) is acceptable, and accordingly SSTL function is to be used, or whether LVDS function is to be used due to the EMC problem, since a lesser EMC problem and/or EMC rate may also arise through the differential construction.

A memory element which is linkable to a processor via address and/or data lines may be provided, the memory element being positioned outside the processor, the address and/or data lines expediently each being implemented in a structure combining LVDS and SSTL, which has corresponding transmitters and receivers, the transmitter and receiver on the side of the memory element being integrated therein.

A device having a processor and a memory element positioned outside the processor, as well as a device for linking the processor to the memory element, may also be provided, the processor and the memory element being linked via address and/or data lines, the address and/or data lines each expediently being implemented in a structure combining LVDS and SSTL, which has corresponding transmitters and receivers.

In an example embodiment of the memory element and the devices, only the data lines are implemented in the structure combining LVDS and SSTL.

In a further example embodiment of the memory element and/or of the devices, an arbitrary number of the address and/or data lines are implemented as bit lines in a structure combining LVDS and SSTL.

In an example embodiment, the structure combining LVDS and SSTL is configured in such a manner that it is possible to switch between LVDS and SSTL functions of the structure by triggering at least one switching arrangement.

In this case, in an example embodiment, the at least one switching arrangement is implemented as a transistor, the transistor simultaneously being used as a supply voltage source Vcc for the SSTL function.

In a further example embodiment, at least two switching arrangements are triggered in order to switch between LVDS and SSTL functions, one of the at least two switching arrangement, the transistors in particular, being used as a power source for the LVDS function.

In a further example embodiment, the switching arrangement which is used to switch between LVDS and SSTL functions is implemented as a transistor having multiple control terminals, not all control terminals being activated for implementing the LVDS functionality.

Therefore, in the structure combining LVDS and SSTL, two address and/or data lines, which are usable in the switched-over state for the LVDS function, may be available as bit lines for an SSTL function.

Using this implementation, a high data rate and a low and/or favorable EMC may be implemented by one structure. Therefore, additional costs for reducing the EMC emission and/or interference may be largely avoided. According to the present invention, the object may therefore be achieved in a manner which takes both aspects cited, high data rate and EMC problem, into consideration in one application.

DETAILED DESCRIPTION

Figure 1A:
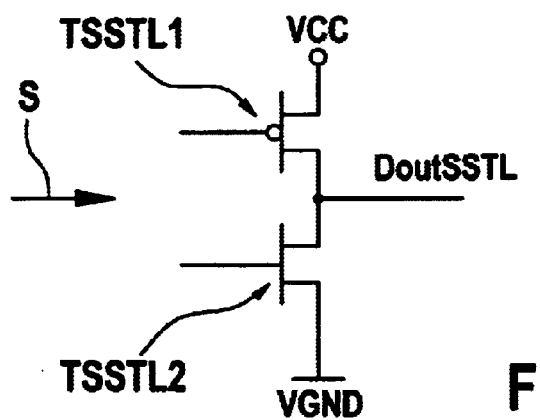
FIG. 1a shows the essential elements of a bus interface in SSTL layout.

FIG. 1a shows the essential parts of an interface circuit in SSTL structure having a transistor TSSTL1 and a transistor TSSTL2. These transistors have signals S applied to them, TSSTL1 receiving a signal inverted in relation to TSSTL2. Both transistors TSSTL1 and TSSTL2 are linked to one another between a supply voltage VCC and ground VGND (voltage ground). Depending on the bit signal desired, output DoutSSTL is pulled by the transistors either to VCC or level 1, i.e., the high level here, or VGND, or the low level here.

Figure 1B:
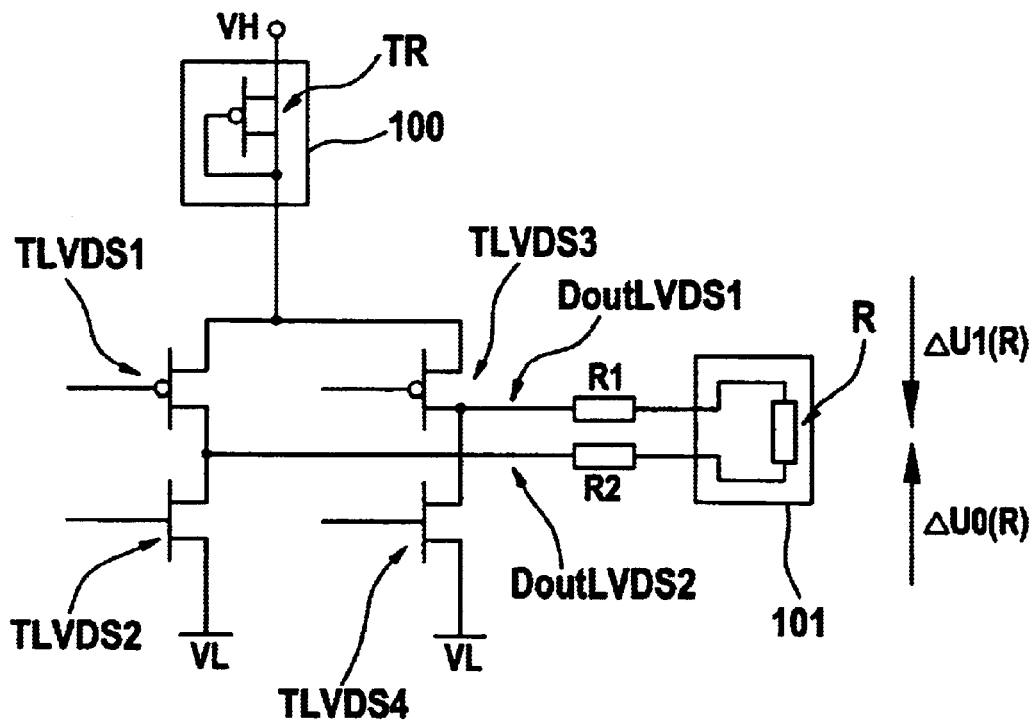
FIG. 1b shows an instance of an LVDS structure according to the present invention.

FIG. 1b shows a structure according to the present invention in low voltage differential structure (LVDS) technology. Four switching arrangements, transistors TLVDS1, TLVDS2, TLVDS3, and TLVDS4 in particular, are contained therein. TLVDS1 and TLVDS2 are linked to one another and are linked in their linkage point to the first of two lines DoutLVDS2. TLVDS3 and TLVDS4 are also linked to one another, line DoutLVDS1 originating in this linkage point. DoutLVDS1 is connected to an element 101 via element R1, in particular a resistor, and DoutLVDS2 is also linked to element 101 via element R2, in particular a resistor.

Transistors TLVDS1 and TLVDS3 have a joint terminal, to which high-level voltage Vhigh, VH is linked. In this case, a control arrangement 100 is provided, which corresponds in particular to a specially wired transistor TR. Transistor TR is connected as a power source in order to provide identical current for both current paths—TLVDS1, TLVDS4 and TLVDS3, TLVDS2—and therefore generate the voltage drop having the identical absolute value at element 101, in particular resistor R, in accordance with LVDS. If a link is produced via TLVDS1, a voltage directed via R2 to DoutLVDS2, and via R and via R1 to DoutLVDS1 and TLVDS4, drops as a function of VL.

This voltage drop ΔU via R directed in this manner may be analyzed for logic level 0 and then corresponds to ΔU0(R).

In contrast, if a link is achieved via TLVDS3, which, when directed, means: a voltage drop via TLVDS3, R1 to DoutLVDS1 via R and via R2 to DoutLVDS2 as a function of VL, this voltage drop ΔU via R, which is directed in the opposite direction to the previous one, may then be analyzed for logic level 1 and/or bit signal 1 and then corresponds to ΔU1(R).

Figure 2:
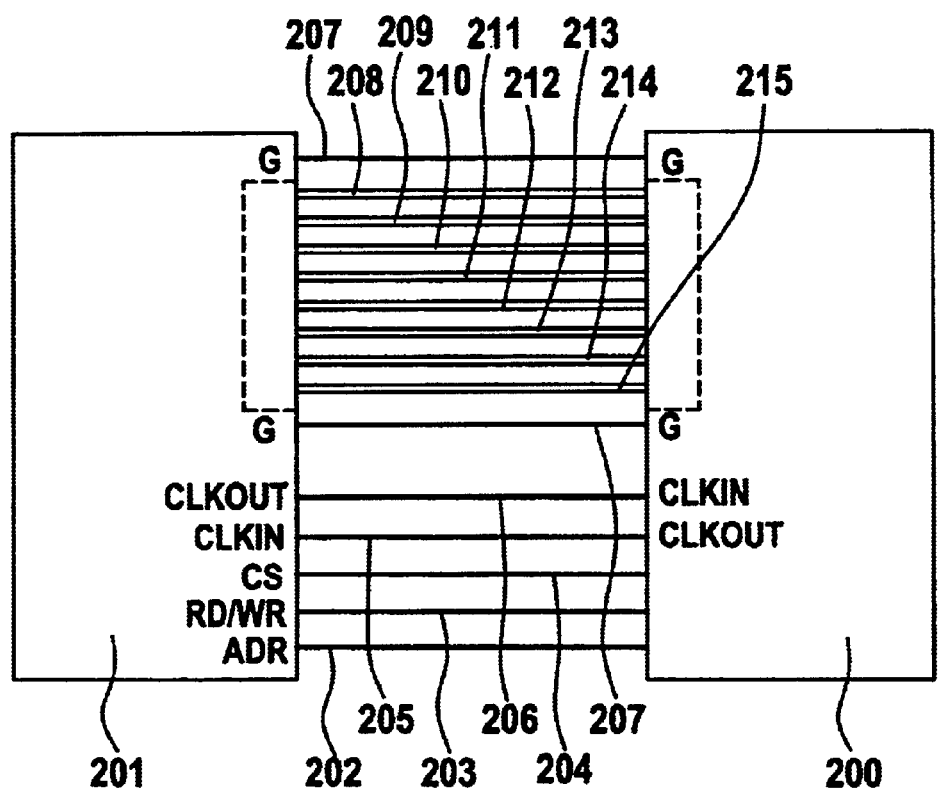
FIG. 2 shows a coupling of an external memory to a computer and/or processor.

A combination of SSTL function and LVDS function is now to be implemented in a device laid out as shown in FIG. 2. For this purpose, FIG. 2 shows a computer and/or processor 201 and a memory 200, which are linked to one another via various lines. Firstly, these are control signal lines 202 to 204, which include, for example, addresses ADR, read-write information RD/WR, and at least one chip select signal CS. These bus control signals correspond to the control signals used in current memory links.

Furthermore, clock signal lines are illustrated by 205 and 206, the particular inputs and/or outputs on the computer and/or memory being indicated by clock-out (CLKOUT) and clock-in (CLKIN). Terminals clock-in (CLKIN) and clock-out (CLKOUT) of the memory are used in this case to eliminate the clock skew of the bit skew. Ground line G (ground), which may be used as shielding, is illustrated by 207.

Figure 3:
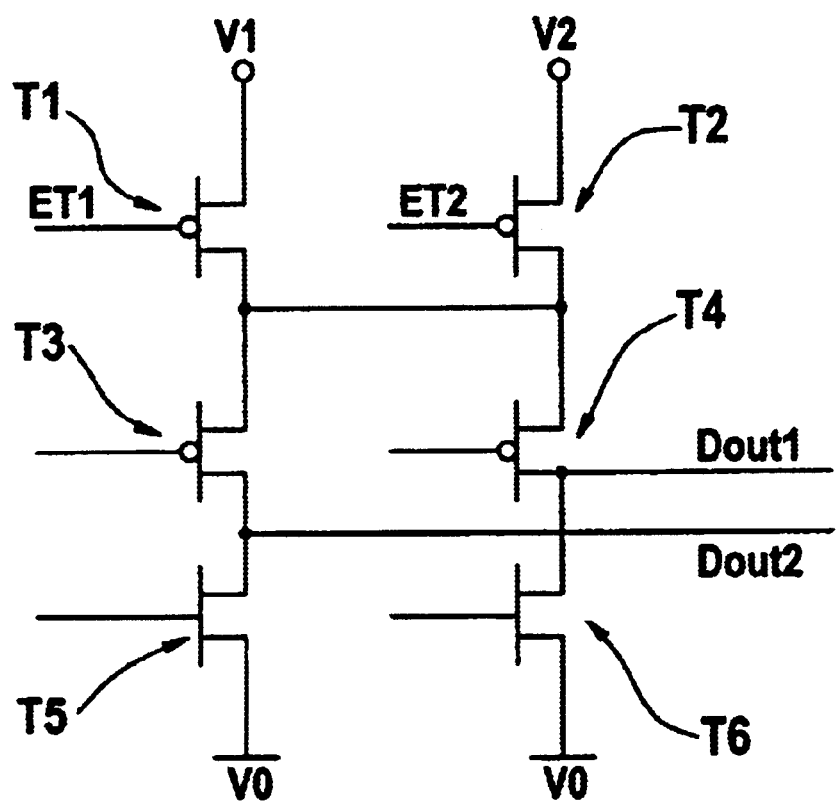
FIG. 3 illustrates the combined structure for implementing the interface having SSTL and LVDS functions.

Eight double-circuit bit lines are illustrated using 208 to 215, each of the transfer paths illustrated in following FIG. 3 having a transmitter and a receiver able to correspond thereto and/or be a selected number thereof. In this manner, a multiplexed 8-bit address data bus may be laid out, the eight data lines being formed by the structure and/or interfaces, which combine SSTL and LVDS, illustrated later in FIG. 3. Therefore, in this example, 16 bit lines are available for an SSTL function and 8 double-circuit lines are available for the LVDS function for differential signal representation.

The present invention is not restricted in this case to the 8 and/or 16 bit lines of the example above; any other arbitrary number of bit lines may also be laid out and used with the technology according to the present invention.

The address information may also be transferred via the bus and/or the bus interface and either the pin count for the bus interface or the performance of the bus itself may be elevated in this manner. In EMC-problematic systems, this problem may also be minimized by switching over.

In the structure illustrated in FIG. 2, the transmitter and receiver shown in the combined SSTL and LVDS structure in FIG. 3 are accordingly optionally integrated, using a terminating resistor between Dout1 and Dout2 as shown in FIG. 3, into the memory and the corresponding counterpart in the computer and/or processor.

FIG. 3 now shows the combined SSTL and LVDS structure according to the object of the present invention. In this case, switching arrangements T1 to T6, for example switches or transistors, etc., are illustrated. In the following, transistors T1 to T6 are referred to, without denying the generality of the switching arrangements. In this case, transistors T1 and T3 are linked to one another, as are T3 and T5, the chain of three transistors T1-T3-T5 cited being connected between a supply voltage potential V1 (high) and a low potential V0 (low), ground potential in particular. The same is true for the link of transistors T2 and T4, as well as T4 and T6, (T2-T4-T6), which are connected between a supply voltage potential V2 (high) and a low potential V0 (low), ground potential in particular.

The links between T1 and T3, as well as T2 and T4, are in turn linked to one another in the linkage points.

In this case, supply voltage potentials V1 and V2 may be different from one another, but they are identical in an example embodiment.

To use the LVDS function in the structure combining SSTL and LVDS, transistors T1 and T2 have control signals ET1 and ET2 applied to them. For the LVDS function, ET1 is connected to low potential and ET2 is connected to high potential. From this, the LVDS functionality then results for transistors T3 and T4, as well as T5 and T6, via lines Dout1 (originating between T4 and T6) and Dout2 (originating between T3 and T5).

To implement the SSTL function, ET1 is connected to high and ET2 is connected to low, with which T2, since it is very low resistance, may be used as a VCC source or supply voltage source, as a V2 source in this case.

When the SSTL function is used, transistors T3 and T5 then produce a bit for the SSTL function via Dout2 and T4 and T6 produce a bit for the SSTL function via Dout1.

If T1 is selected to have a higher resistance than T2, T1 may be used as a power source for the LVDS function.

In an example embodiment, when the LVDS function is used with high currents, and therefore low-resistance T2, transistor T2 may expediently be dispensed with entirely.

A separate example embodiment or variant results if transistor T1 is implemented as a switching arrangement having multiple control terminals, i.e., gates in FET technology (field effect transistor) or bases in bipolar technology, and not all control terminals, gates in particular, are activated for the LVDS function.

Like the other object of the present invention just described, this separate variant also then may achieve the combination of SSTL and LVDS function into one bus interface as a structure combining SSTL and LVDS.

In this manner, both the aspects of good electromagnetic compatibility and high data transfer rate may be taken into consideration in one application.

What is claimed is:

1. A device, comprising:

a processor;

a memory element positioned outside the processor;

at least one of address and data lines for linking the processor and the memory element;

a structure for implementing each of the at least one of address and data lines, the structure including a differential structure and an additional structure having transistors for switching to a ground and a voltage, and including corresponding transmitters and receivers; and at least one switching arrangement triggerable for switching between a differential function and a function of the additional structure, the differential structure and the additional structure being arranged to permit the switching;

wherein the at least one switching arrangement includes as a transistor serving as a supply voltage source for the function of the additional structure.

2. The device according to claim 1, wherein the function of the additional structure includes a SSTL function.

3. The device according to claim 1, wherein at least two switching arrangements are triggered in order to switch between the differential function and the function of the additional structure, one of the at least two switching arrangements being used as a power source for the differential function.

4. The device according to claim 3, wherein the differential function includes a LVDS.

5. The device according to claim 3, wherein the function of the additional element includes a SSTL.

6. A device, comprising:

a processor;

a memory element positioned outside the processor;

at least one of address and data lines for linking the processor and the memory element; and a structure for implementing each of the at least one of address and data lines, the structure including a differential structure and an additional structure having transistors for switching to a ground and a voltage, and including corresponding transmitters and receivers; and at least one switching arrangement triggerable for switching between a differential function and a function of the additional structure, the differential structure and the additional structure being arranged to permit the switching;

wherein the at least one switching arrangement includes a transistor having multiple control terminals, not all of the multiple control terminals being activated for the differential function.

7. The device according to claim 6, wherein the differential function includes a LVDS.

* * * * *